United States Patent
Lin et al.

(10) Patent No.: US 12,500,329 B2
(45) Date of Patent: Dec. 16, 2025

(54) ANTENNA PACKAGING STRUCTURE AND MANUFACTURING METHOD THEREOF

(71) Applicant: JCET GROUP CO., LTD., Wuxi (CN)

(72) Inventors: Yaojian Lin, Wuxi (CN); Shuo Liu, Wuxi (CN); Chen Xu, Wuxi (CN); Danfeng Yang, Wuxi (CN)

(73) Assignee: JCET GROUP CO., LTD., Wuxi (CN)

( * ) Notice: Subject to any disclaimer, the term of this patent is extended or adjusted under 35 U.S.C. 154(b) by 440 days.

(21) Appl. No.: 18/035,520

(22) PCT Filed: May 19, 2021

(86) PCT No.: PCT/CN2021/094566
§ 371 (c)(1),
(2) Date: May 5, 2023

(87) PCT Pub. No.: WO2022/105161
PCT Pub. Date: May 27, 2022

(65) Prior Publication Data
US 2023/0411826 A1    Dec. 21, 2023

(30) Foreign Application Priority Data

Nov. 17, 2020  (CN) .......................... 202011284065.5

(51) Int. Cl.
*H01Q 1/22*     (2006.01)
*H01L 23/498*   (2006.01)
(Continued)

(52) U.S. Cl.
CPC ..... *H01Q 1/2283* (2013.01); *H01L 23/49833* (2013.01); *H01L 23/552* (2013.01);
(Continued)

(58) Field of Classification Search
CPC .......... H01Q 1/2283; H01Q 1/38; H01Q 1/40; H01Q 1/526; H01Q 9/0414; H01Q 21/0075
See application file for complete search history.

(56) References Cited

U.S. PATENT DOCUMENTS

2014/0145883 A1*  5/2014  Baks ....................... H01L 23/66
                                                  343/700 MS
2020/0035625 A1*  1/2020  Wang .................... H01L 23/552
(Continued)

FOREIGN PATENT DOCUMENTS

CN      107342233 A      11/2017
CN      108538794 A       9/2018
(Continued)

*Primary Examiner* — Awat M Salih
(74) *Attorney, Agent, or Firm* — Muncy, Geissler, Olds & Lowe, P.C.

(57) ABSTRACT

The present invention provides an antenna packaging structure and a manufacturing method thereof. An antenna and a chip are respectively disposed on two sides of a substrate layer, antenna layers are formed by an antenna support member, a first antenna layer located above the antenna support member and a second antenna layer located below the antenna support member together, and interlayer dielectrics of the antenna support member and the antenna layers are low dielectric loss materials, so that a heterogeneous and isomerous antenna structure is formed, thereby reducing the problems such as current leakage and stray capacitance in the packaging structure caused by dielectric loss, and reducing a size of the antenna packaging structure.

20 Claims, 4 Drawing Sheets

(51) Int. Cl.
*H01L 23/552* (2006.01)
*H01L 23/58* (2006.01)
*H01Q 1/52* (2006.01)
*H01L 23/00* (2006.01)

(52) U.S. Cl.
CPC ............ *H01L 23/58* (2013.01); *H01Q 1/526* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(56) References Cited

U.S. PATENT DOCUMENTS

| | | | |
|---|---|---|---|
| 2020/0227365 A1* | 7/2020 | Tseng | H01L 21/4817 |
| 2020/0328518 A1 | 10/2020 | Park et al. | |
| 2020/0395675 A1* | 12/2020 | Han | H01Q 9/0414 |
| 2021/0398904 A1* | 12/2021 | Ho | H01L 23/5386 |
| 2022/0157746 A1* | 5/2022 | Ho | H01Q 21/065 |

FOREIGN PATENT DOCUMENTS

| | | |
|---|---|---|
| CN | 110148587 A | 8/2019 |
| CN | 209515978 U | 10/2019 |
| CN | 210182380 U | 3/2020 |

* cited by examiner

ANTENNA PACKAGING STRUCTURE AND MANUFACTURING METHOD THEREOF

CROSS REFERENCE TO RELATED APPLICATIONS

The present invention is a 35 U.S.C. § 371 National Phase conversion of International (PCT) Patent Application No. PCT/CN2021/094566, filed on May 19, 2021, which claims benefit of Chinese Application No. 202011284065.5, filed on Nov. 17, 2020, the disclosure of which is incorporated by reference herein. The PCT International Patent Application was filed and published in Chinese.

TECHNICAL FIELD

The present invention relates to the field of packaging technologies, in particular to an antenna packaging structure and a manufacturing method thereof.

BACKGROUNDING

With the popularity of high-tech electronic products and the increase of people's demands, especially for meeting the mobile demand, most high-tech electronic products have increased a function of wireless communication. At present, wireless communication equipment usually includes an antenna module and one or more integrated circuits. The antenna module and the integrated circuit may be disposed in several different ways (for example, antenna-in-package (AIP), antenna-on-package (AOP), and antenna-on-chip (AOC)).

Electrical signals between the antenna module and the integrated circuit usually need to be transmitted through one or more conductive circuits and/or one or more through holes. These circuits and through holes are made of or filled by conductive materials, and are in contact with and/or at least partially surrounded by dielectric materials. Since the conventional dielectric materials (such as silicon or molding compounds) have higher dielectric loss, problems such as current leakage and stray capacitance are easily generated. Moreover, due to limited performances of the conventional dielectric materials, the reliability of packaging structures under conditions such as high temperature and high voltage is poor, which is not conducive to miniaturization of the packaging structures.

SUMMARY

An object of the present invention is to provide an antenna packaging structure and a manufacturing method thereof.

The present invention provides an antenna packaging structure. The antenna packaging structure includes: a substrate layer, interconnection structural members, an antenna support member, a first antenna layer, a chip and a plastic packaging layer;

the substrate layer includes at least one chip circuit layer, at least one antenna control layer and at least one second antenna layer which are stacked in sequence, and dielectric loss tangent values of interlayer dielectrics of the first antenna layer and the second antenna layer are less than 0.01, respectively;

the first antenna layer is electrically connected to the second antenna layer through the interconnection structural members;

the antenna support member is attached to one side of the first antenna layer toward the second antenna layer, and has a dielectric loss tangent value less than 0.01;

the chip is disposed on the control circuit layer opposite to the first antenna layer; and the plastic packaging layer wraps the substrate layer, the antenna support member, the first antenna layer, the interconnection structural members and the chip.

As a further improvement of the present invention, the antenna support member is one or more of a single-layer or multi-layer organic composite substrate, a plastic packaging part, a glass part and a low-temperature co-fired ceramic part.

As a further improvement of the present invention, the antenna support member is a pure dielectric member or a resonant cavity with metal on other five side surfaces except a surface connected to the first antenna layer.

As a further improvement of the present invention, interlayer dielectric materials of the first antenna layer and the second antenna layer are resin with a dielectric constant not greater than 3.9 or a polymer dielectric material with filler.

As a further improvement of the present invention, the antenna control layer includes an antenna signal control circuit and an antenna signal sending and receiving circuit.

As a further improvement of the present invention, the antenna packaging structure is provided with a first moisture barrier layer on an outer side of the plastic packaging layer, and the first moisture barrier layer at least wraps the first antenna layer, the antenna support member and the second antenna layer.

As a further improvement of the present invention, the antenna packaging structure further includes the interconnection structural members disposed on the second antenna layer and the chip circuit layer, and the interconnection structural members are electrically connected to a substrate layer circuit.

As a further improvement of the present invention, the interconnection structural members are conductive metal posts and/or composite structural members.

As a further improvement of the present invention, the composite structural member includes a main body member made of a dielectric material, and a conductive through hole located inside the main body member and configured to communicate upper and lower surfaces of the main body member, wherein a metal connector or conductive filler is disposed in the conductive through hole to be electrically connected to the circuit layer, and the composite structural members disposed on one side of the second antenna layer are distributed in gaps and at peripheral sides of the antenna support member.

As a further improvement of the present invention, parts of the interconnection structural members located on both sides of the packaging structure are further provided with lateral antenna layers, and the lateral antenna layers are disposed toward side edges of the antenna packaging structure.

As a further improvement of the present invention, a side wall of the interconnection structural member is provided with a heat-radiating structural member and/or a second moisture barrier layer, and the second moisture barrier layer is exposed to or buried in the plastic packaging layer.

As a further improvement of the present invention, a plastic pre-packaging layer is disposed at peripheral sides of the antenna support member and the interconnection structural members.

As a further improvement of the present invention, the plastic packaging layer includes a first plastic packaging layer and a second plastic packaging layer, wherein the first plastic packaging layer at least wraps an upper surface of the substrate layer, a side surface of the antenna support member, side surfaces of the interconnection structural members and the first antenna layer, the second plastic packaging layer at least wraps a side surface of the chip and the side surfaces of the interconnection structural members, and a material of the first plastic packaging layer and a material of the second plastic packaging layer are different.

As a further improvement of the present invention, the antenna packaging structure is further provided with an electromagnetic shielding layer at the outer side of the plastic packaging layer, and the electromagnetic shielding layer at least covers a side direction of the chip and a side direction of the chip circuit layer; the electromagnetic shielding layer includes an adhesive layer attached to the plastic packaging layer, a protective layer exposed to air, and a main shielding layer disposed between the adhesive layer and the protective layer; the side wall of the interconnection structural member is provided with a metal structural member; and the metal structural member is exposed to the plastic packaging layer and electrically connected to the electromagnetic shielding layer in a grounding way.

As a further improvement of the present invention, the electromagnetic shielding layer is provided with a through hole for exposing the metal structural member, and the through hole is filled with sintered conductive paste or soldering tin.

As a further improvement of the present invention, the antenna packaging structure further includes a microwave integrated circuit and/or a power management chip and/or a passive device disposed on the chip circuit layer.

The present invention further provides a packaging method of an antenna packaging structure. The method includes the following steps:

providing a temporary carrier plate, and disposing a first antenna layer and interconnection structural members on the temporary carrier plate, the first antenna layer taking a dielectric material with a dielectric loss tangent value less than 0.01 as an interlayer dielectric;

attaching an antenna support member with a dielectric loss tangent value less than 0.01 on the first antenna layer;

forming at least one second antenna layer, at least one antenna control layer and at least one chip circuit layer into a prefabricated substrate layer single block or strip, and electrically bonding the interconnection structural members on the first antenna layer, the second antenna layer taking a dielectric material with a dielectric loss tangent value less than 0.01 as an interlayer dielectric;

filling a first plastic packaging layer to wrap the substrate layer, the interconnection structural members, the antenna support member and the first antenna layer; and removing the temporary carrier plate, disposing the interconnection structural members and at least one chip on the chip circuit layer, forming a second plastic packaging layer, and forming a single antenna packaging structure by cutting.

As a further improvement of the present invention, the antenna support member is one or more of an organic single-layer or multi-layer composite substrate, a plastic packaging layer, a glass part and a low-temperature co-fired ceramic part, and the antenna support member may be a pure dielectric member or a resonant cavity with metal on other five side surfaces except a surface connected to the first antenna layer.

As a further improvement of the present invention, an interlayer dielectric material of the second antenna layer is resin with a dielectric constant not greater than 3.9 or a polymer dielectric material with filler.

As a further improvement of the present invention, the chip circuit layer includes an antenna signal control circuit and an antenna signal sending and receiving circuit.

As a further improvement of the present invention, the interconnection structural members on the second antenna layer are conductive metal posts.

As a further improvement of the present invention, the interconnection structural member includes a main body member made of a dielectric material, and a metal connector located inside the main body member and configured to communicate upper and lower surfaces of the main body member, and the metal connector is electrically connected to a circuit layer on the substrate layer.

As a further improvement of the present invention, the interconnection structural members disposed on one side of the second antenna layer are distributed in gaps and at peripheral sides of the antenna support member, and upper surfaces of the interconnection structural members are lower than an upper surface of the first antenna layer.

As a further improvement of the present invention, parts of the interconnection structural members located on both sides of the packaging structure are further provided with lateral antenna layers, and the lateral antenna layers are disposed toward side edges of the antenna packaging structure.

As a further improvement of the present invention, a side wall of the interconnection structural member is provided with a heat-radiating structural member and/or a second moisture barrier layer, and the second moisture barrier layer is exposed to the plastic packaging layer.

As a further improvement of the present invention, the packaging method further includes the following step:

sequentially depositing an adhesive layer, a main shielding layer and a protective layer on an outer side of the antenna packaging structure to form an electromagnetic shielding layer, the electromagnetic shielding layer at least covering the chip and the chip circuit layer.

As a further improvement of the present invention, the electromagnetic shielding layer is provided with a through hole for exposing the interconnection structural member, and the through hole is filled with sintered conductive paste or soldering tin.

As a further improvement of the present invention, the packaging method further includes the following step:

forming a first moisture barrier layer on the outer side of the antenna packaging structure, the first moisture barrier layer at least wrapping the first antenna layer, the antenna support member and the second antenna layer.

As a further improvement of the present invention, the antenna packaging structure further includes a microwave integrated circuit, a power management chip and a passive device disposed on the chip circuit layer.

The present invention has the beneficial effects that an antenna and the chip are respectively disposed on two sides of the substrate layer, the antenna layers are formed by the antenna support member, the first antenna layer located above the antenna support member and the second antenna layer located below the antenna support member together, and the interlayer dielectrics of the antenna support member and the antenna layers are low dielectric loss materials, so that a heterogeneous and isomerous antenna structure is formed, thereby reducing the problems such as current leakage and stray capacitance in the packaging structure caused by dielectric loss, and reducing a size of the antenna packaging structure.

DETAILED DESCRIPTION

In order to clarify the objects, technical solutions and advantages of the present application, the technical solutions of the present application will be described clearly and fully in combination with specific embodiments and corresponding accompanying drawings of the present application. It is obvious that the described embodiments are just a part but not all of the embodiments of the present application. Based on the embodiments of the present application, those of ordinary skill in the art can obtain all other embodiments, without any inventive work, which should be within the protection scope of the present application.

The embodiments of the present invention will be described in detail below, and examples of the embodiments are illustrated in the accompanying drawings. The reference signs which are the same or similar throughout the accompanying drawings represent the same or similar elements or elements with the same or similar functions. The embodiments described below with reference to the accompanying drawings are exemplary and intended to be illustrative only, and are not to be construed as limitations to the present invention.

The terms "upper", "lower", "back", "front", and the like as used here, which denote spatial relative positions, describe the relationship of a unit or feature relative to another unit or feature in the accompanying drawings for the purpose of illustration. The terms of the spatial relative positions may include different orientations of the device in use or operation other than the orientations shown in the accompanying drawings. For example, the units that are described as being located "below" or "above" other units or features will be located "below" or "above" other units or features if the apparatus in the accompanying drawings is turned upside down. Thus, the exemplary term "below" can encompass both the orientations of "below" and "above".

Figure 1:
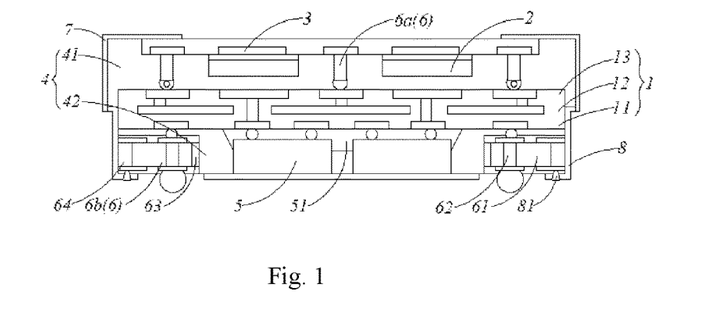
FIG. 1 is a schematic diagram of an antenna packaging structure in an embodiment of the present invention.

As shown in FIG. 1, the present invention provides an antenna packaging structure. The antenna packaging structure includes a substrate layer 1, an antenna support member 2, a first antenna layer 3, interconnection structural members 6, a plastic packaging layer 4 and at least one chip 5.

The substrate layer 1 includes a chip circuit layer 11, an antenna control layer 12 and at least one second antenna layer 13 which are stacked in sequence, wherein dielectric loss tangent values of interlayer dielectrics of the first antenna layer 11 and the second antenna layer 13 are less than 0.01, and the substrate layer 1 is prefabricated separately.

The antenna control layer 12 includes an antenna signal control circuit and an antenna signal sending and receiving circuit.

Specifically, in the present embodiment, an interlayer dielectric material of the second antenna layer 13 is resin with a dielectric constant not greater than 3.9 or a polymer dielectric material with filler. By selecting a material with a low dielectric constant and a low dielectric loss as the interlayer dielectric material of the second antenna layer 13, the dielectric loss and capacitive reactance in the antenna circuit can be reduced, thereby reducing the problems such as current leakage and stray capacitance caused by the dielectric loss.

The first antenna layer 3 is electrically connected to the second antenna layer 13 through the interconnection structural members 6.

The antenna support member 2 is attached to one side of the first antenna layer 3 toward the second antenna layer 13, and has a dielectric loss tangent value less than 0.01.

Further, in the present embodiment, the interconnection structural members 6 disposed on one side of the second antenna layer 13 are conductive metal posts 6a, such as copper posts, and are electrically connected to the substrate layer 1 by copper cores or plastic core solder balls.

The interconnection structural members 6 disposed on one side of the chip circuit layer 11 are composite structural members 6b. The composite structural member 6b includes a main body member 61 made of a dielectric material, and a conductive through hole 62 or folded hole located inside the main body member 61 and configured to communicate upper and lower surfaces of the main body member 61. The conductive through hole 62 is provided with a metal connector or conductive filler therein to be at least electrically connected to the grounding circuit layer.

The upper and lower surfaces of the main body member 61 are plated with metal layers, and the composite structural member 6b is electrically connected to the circuit layer by soldering tin or conductive adhesive/paste.

Further, the main body member 61 may also be an organic composite substrate, a glass part and a low-temperature co-fired ceramic part with a low dielectric loss to further reduce the dielectric loss in the packaging structure; or the main body member 61 may also be made of organic polymer resin with inorganic filler, or organic polymer resin with glass fiber cloth and filler, synthetic resin and other polymer materials with a certain structural strength.

The side wall of the interconnection structural member 6b is provided with a heat-radiating structural member 63 and/or a second moisture barrier layer 64. The second moisture barrier layer 64 is exposed to or buried in the plastic packaging layer 4, and the heat-radiating structural member 63 is a columnar or thin-layer structural member made of a material with high thermal conductivity, such as a copper post, thereby further improving the reliability of the packaging structure under the conditions of high temperature and high humidity.

Figure 2:
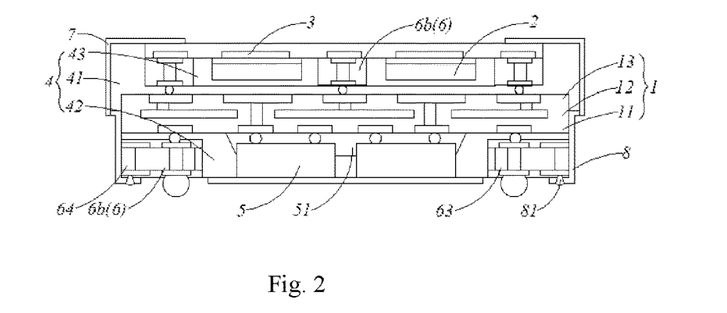
FIG. 2 is a schematic diagram of an antenna packaging structure in another embodiment of the present invention.

As shown in FIG. 2, in some other embodiments of the present invention, the composite structural members 6b are disposed on the second antenna layer 13 and the chip circuit layer 11, and the composite structural members 6b disposed on one side of the second antenna layer 13 are distributed in gaps and at peripheral sides of the antenna support member 2, so that the space in the packaging structure can be utilized to the maximum extent.

Of course, the structure and distribution position of the interconnection structural member 6 are not limited thereto, as long as a function of electrical connection can be achieved.

Further, in some embodiments of the present invention, a plastic pre-packaging layer 43 is disposed at peripheral sides of the antenna support member 2 and the interconnection structural members 6.

Figure 3:
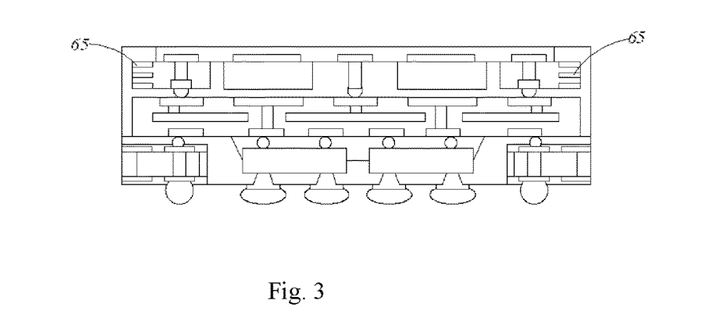
FIG. 3 is a schematic diagram of a substrate layer and antenna layers in the antenna packaging structure in another embodiment of the present invention, in which parts of interconnection structural members on both sides of the packaging structure are provided with lateral antenna layers.

As shown in FIG. 3, in some other embodiments of the present invention, parts of the interconnection structural members 6 located on both sides of the packaging structure are further provided with lateral antenna layers 65, and the lateral antenna layers 65 are disposed toward side edges of the antenna packaging structure. The interconnection structural members 6 are provided with circuits or conductive connectors therein which are electrically communicated with the lateral antenna layers 65 and the antenna control layer 12.

The antenna support member 2 is made of a material with low dielectric loss, so that the antenna circuit forms a heterogeneous and isomerous split structure. As the main body member 61 of the antenna circuit, the antenna support member 2 can reduce the dielectric loss in the circuit.

Specifically, the shape of the antenna support member 2 may be specifically set according to a planar arrangement shape of the first antenna layer 3 and the number of antenna modules in the first antenna layer 3. The horizontal profile shape of the antenna support member 2 is approximately similar to the planar arrangement shape of the antenna circuit of the first antenna layer 3, so that the antenna support member 2 with a low dielectric loss can reduce the space occupied in the packaging structure while playing a good supporting role for the first antenna.

Furthermore, the antenna support member 2 is one or more of an organic composite substrate, a glass part and a low-temperature co-fired ceramic part. The organic composite substrate and the glass part have both a low dielectric constant and a low dielectric loss, and the low-temperature co-fired ceramic has a high dielectric constant while having the low dielectric loss. The antenna support member 2 is a pure dielectric member or a resonant cavity with metal on other five side surfaces except a surface connected to the first antenna layer 3. Under the condition of ensuring the lower dielectric loss, by using the antenna support members 2 with different dielectric constants, the packaging structure can be applied to the chips 5 with different use conditions, and the requirement of the packaging structure for high-density integration can be met.

The antenna support member 2 is attached to the first antenna layer 3 by a material such as a chip film or adhesive paste, and the chip film or adhesive paste may cover the whole surface of the first antenna layer 3, or partially extend to the interconnection structural members 6.

The chip 5 is disposed on the chip circuit layer 11, that is, the chip 5 and the antenna layers are respectively disposed on two opposite surfaces of the substrate layer 1. The antenna layers and the chip 5 are respectively disposed on both sides of the substrate layer 1, on one hand, the circuit layer on the substrate layer 1 can be disposed in layers, the chip 5 and the chip circuit layer 11 are disposed on one side, and the antenna control circuit layer and the antenna layers are disposed on the other side, so that the distribution design can be respectively carried out on the substrate layer 1 in sequence. On the other hand, signal interference of the antenna layers to the chip 5 can be reduced.

Figure 4:
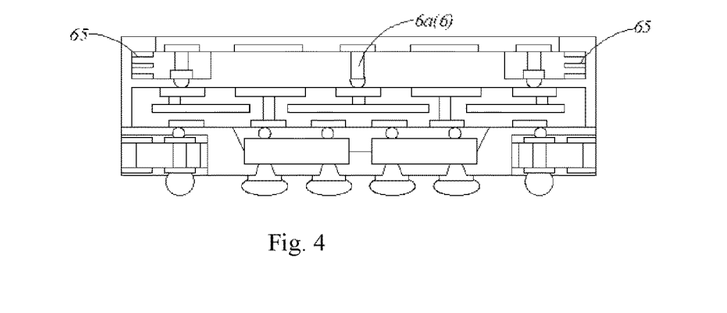
FIG. 4 is a schematic diagram of the substrate layer and the antenna layers in the antenna packaging structure in another embodiment of the present invention, in which an antenna support member is omitted.

As shown in FIG. 4, in some embodiments of the present invention, the antenna support member 2 on the antenna side may also be omitted, and the first antenna layer 3 and the second antenna layer 13 are connected only by the interconnection structural members 6.

The plastic packaging layer 4 wraps the substrate layer 1, the antenna support member 2, the first antenna layer 3 and the chip 5. The plastic packaging layer 4 is formed by filling with a plastic packaging material, wherein the plastic packaging material may be a high-molecular polymer composite material with filler, such as epoxy resin, polyimide or a dry film. The plastic packaging layer 4 provides physical support for the packaging structure and protects elements in the packaging structure.

Further, in the present embodiment, the plastic packaging layer 4 includes a first plastic packaging layer 41 and/or a second plastic packaging layer 42. The first plastic packaging layer 41 wraps the substrate layer 1, the antenna support member 2 and the first antenna layer 3, and the second plastic packaging layer 42 wraps the chip 5. The first plastic packaging layer 41 and the second plastic packaging layer 42 are made of different plastic packaging materials, so as to adjust the problem of warpage of the packaging structure by using the differences of thermal expansion coefficients of different plastic packaging materials. In another implementation method, the first or second plastic packaging layer may also wrap the substrate layer 1, the antenna support member 2, the first antenna layer 3, the chip 5 and the interconnection structural members 6 at the same time.

It should be noted that according to the difference in the sequence of process steps in a manufacturing process, there are differences between the devices respectively wrapped by the first plastic packaging layer 41 and the second plastic packaging layer 42. For example, the first plastic packaging layer 41 wraps the antenna support member 2 and the first antenna layer 3, and the second plastic packaging layer 42 wraps the substrate layer 1 and the chip 5.

In some embodiments of the present invention, the antenna packaging structure is further provided with a first moisture barrier layer 7 at the outer side of the plastic packaging layer 4, wherein the first moisture barrier layer 7 at least wraps the first antenna layer 3, the antenna support member 6 and the second antenna layer 13, thereby further improving the reliability of the packaging structure under high humidity conditions.

In some embodiments of the present invention, underfill 51 is further disposed between the chip 5 and the chip circuit layer 11.

In some embodiments of the present invention, the antenna packaging structure further includes a microwave integrated circuit and/or a power management chip and/or a passive device disposed on the chip circuit layer 11. The passive device includes a capacitor, a resistor and the like, or other functional devices such as a heat-radiating fin and a reinforcement rib.

In some embodiments of the present invention, the antenna packaging structure is further provided with an electromagnetic shielding layer 8 at the outer side of the packaging layer, wherein the electromagnetic shielding layer 8 at least covers the chip 5 and the chip circuit layer 11, so as to reduce electromagnetic interference on the chip 5.

Specifically, the electromagnetic shielding layer 8 includes an adhesive layer attached to the plastic packaging layer 4, a protective layer exposed to air, and a main shielding layer disposed between the adhesive layer and the protective layer. The adhesive layer is made of a metal material with higher adhesion, such as copper, or an organic material with high adhesion, so as to strengthen a bonding strength between the electromagnetic shielding layer 8 and the packaging structure. The main shielding layer is made of a sputtering interlayer metal film material such as copper, stainless steel or titanium, or conductive resin containing high-density metal filler such as silver/copper and other conductive composite materials, or a combination of at least two of the above materials, as long as the effects of shielding or absorbing electromagnetic waves are achieved. The protective layer is a stainless steel (7% NiV) or CrCu alloy layer, or an organic moisture barrier layer, and the like to further enhance the reliability of the packaging structure under high humidity conditions.

Further, the side wall of the interconnection structural member 6 is provided with a metal structural member, wherein the metal structural member is exposed to the plastic packaging layer 4 and electrically connected to the electromagnetic shielding layer 8.

Furthermore, a through hole 81 exposing the metal structural member is formed in the electromagnetic shielding layer 8, wherein the through hole 81 is filled with sintered conductive paste or soldering tin, to enhance grounding connection of the electromagnetic shielding layer.

According to the difference in the sequence of process steps in a manufacturing process, the position of part of a horizontal cutting surface covered by the electromagnetic shielding layer 8 is different.

Figure 5:
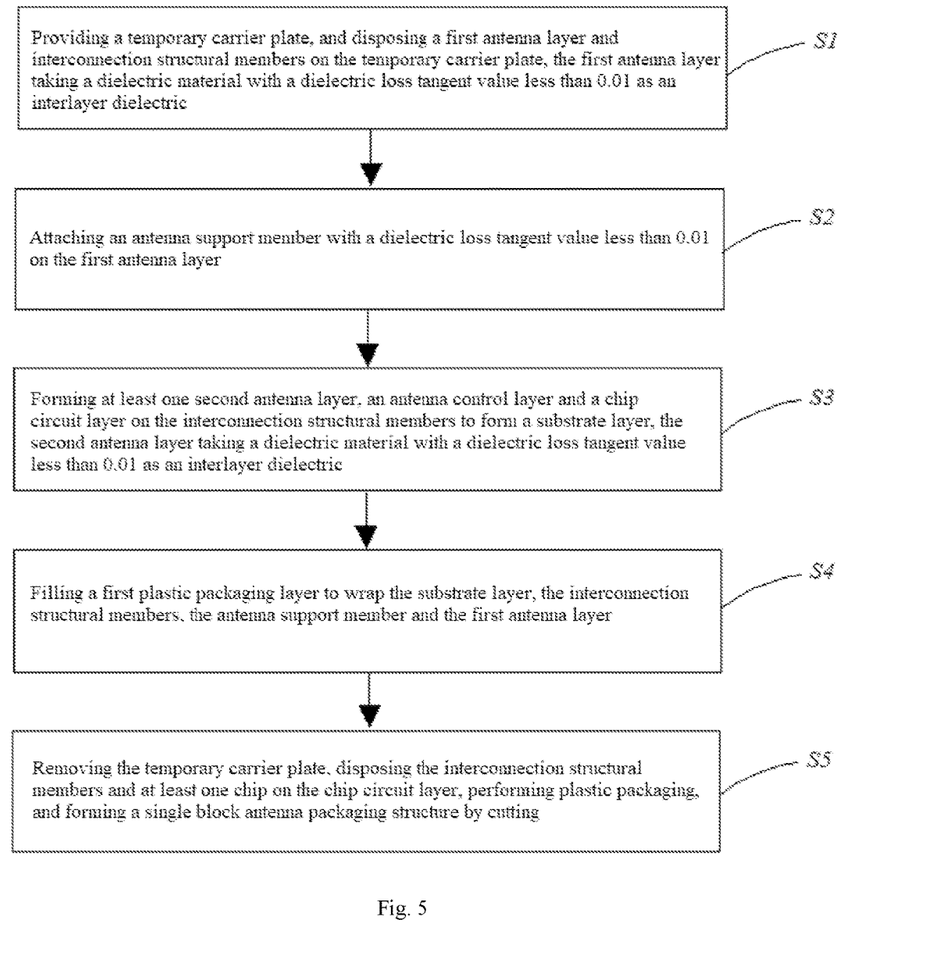
FIG. 5 is a flowchart of manufacturing of an antenna packaging structure in an embodiment of the present invention.

As shown in FIG. 5, the present invention further provides a packaging method of an antenna packaging structure. The packaging method includes the following steps.

Figure 6:
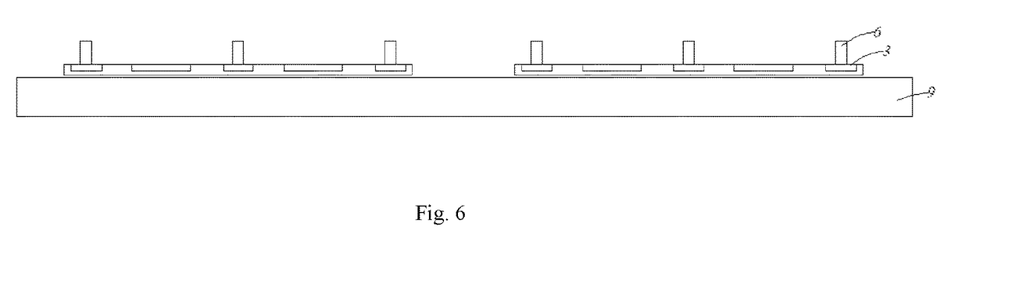
FIG. 6 to FIG. 11 are schematic diagrams of respective steps in a manufacturing process of an antenna packaging structure in an embodiment of the present invention.

In S1, as shown in FIG. 6, a temporary carrier plate 9 with an optional temporary bonding layer is provided, and a first antenna layer 3 and interconnection structural members 6 are disposed on the temporary carrier plate 9, wherein the first antenna layer 3 takes a dielectric material with a dielectric loss tangent value less than 0.01 as an interlayer dielectric.

The temporary carrier plate 9 is a sacrificial base material, such as glass, silicon and composite polymer, which is low-cost and has a certain rigidity for structural support.

Specifically, in the present embodiment, an interlayer dielectric material of the first antenna layer 3 is resin with a dielectric constant not greater than 3.9 or a polymer dielectric material with filler.

Further, in the present embodiment, the interconnection structural member 6 is a conductive metal post, such as a cylindrical and cuboid copper post.

In some other embodiments of the present invention, the interconnection structural member 6 includes a main body member 61 made of a dielectric material, and a metal connector located inside the main body member 61 and configured to communicate upper and lower surfaces of the main body member 61, and the metal connector is electrically connected to a grounding circuit layer on a substrate layer 1.

The upper and lower surfaces of the main body member 61 are plated with metal layers, and the interconnection structural member 6 is electrically connected to the grounding circuit layer by soldering tin or conductive adhesive/paste.

Further, the main body member 61 is an organic composite substrate, a glass part and a low-temperature co-fired ceramic part with a low dielectric loss to further reduce the dielectric loss in the packaging structure; or the main body member 61 may also be made of organic polymer resin with inorganic filler, or organic polymer resin with glass fiber cloth and filler, synthetic resin and other polymer materials with a certain structural strength.

In some other embodiments of the present invention, parts of the interconnection structural member 6 located on both sides of the packaging structure are further provided with lateral antenna layers 65, and the lateral antenna layers 65 are disposed toward side edges of the antenna packaging structure.

In some other embodiments of the present invention, the side wall of the interconnection structural member 6 is provided with a heat-radiating structural member 63 and/or a second moisture barrier layer 64. The second moisture barrier layer 64 is exposed to or buried in the plastic packaging layer 4.

Figure 7:
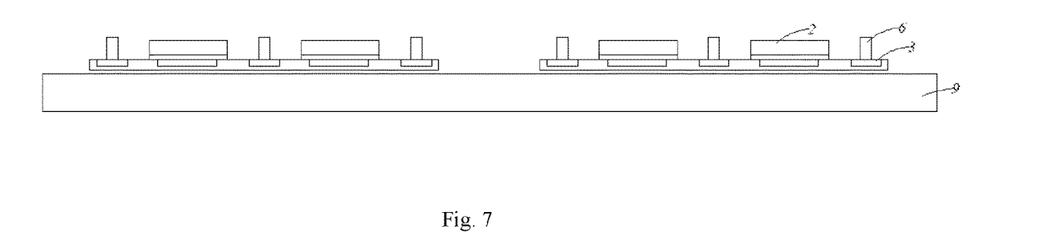

In S2, as shown in FIG. 7, an antenna support member 2 having a dielectric loss tangent value less than 0.01 is attached to the first antenna layer 3.

Specifically, in the present embodiment, the antenna support member 2 is one or more of an organic single-layer or multi-layer composite substrate, a plastic packaging part, a glass part and a low-temperature co-fired ceramic part. The antenna support member 2 is a pure dielectric member or a resonant cavity with metal on other five side surfaces except a surface connected to the first antenna layer 3.

The antenna support member 2 is attached to the first antenna layer 3 by a material such as a film or adhesive paste.

The interconnection structural members 6 are distributed in gaps and at peripheral sides of the antenna support member 2.

Figure 8:
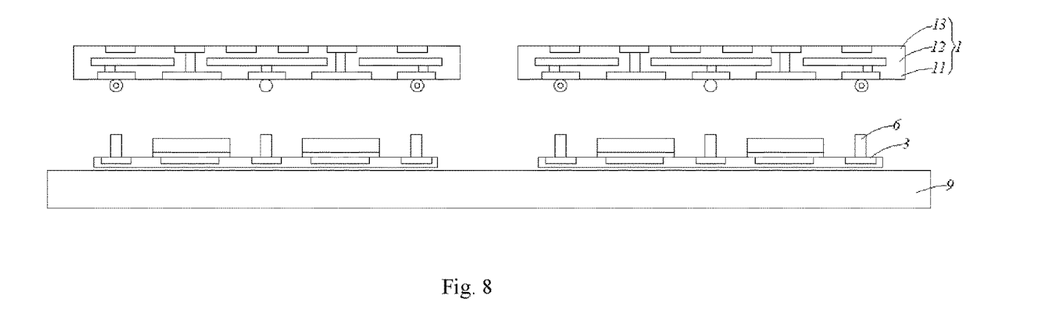

In S3, as shown in FIG. 8, a prefabricated substrate layer 1 formed by at least one second antenna layer 13, an antenna control layer 12 and a chip circuit layer 11 is disposed on the interconnection structural members 6, and the second antenna layer 13 takes a dielectric material with a dielectric loss tangent value less than 0.01 as an interlayer dielectric.

In another embodiment, the prefabricated substrate layer 1 may be pre-bonded to the chip and the interconnection structural members 6, then the prefabricated substrate layer 1 and the chip are disposed on the interconnection structural members 6 together for tin soldering reflow bonding, and the substrate layer 1 may be pre-bonded to tin balls with copper/plastic cores and/or conventional SnAgCu balls.

Further, the antenna control layer 12 includes an antenna signal control circuit and an antenna signal sending and receiving circuit.

Specifically, in the present embodiment, an interlayer dielectric material of the second antenna layer 13 is resin with a dielectric constant not greater than 3.9 or a polymer dielectric material with filler.

Figure 9:
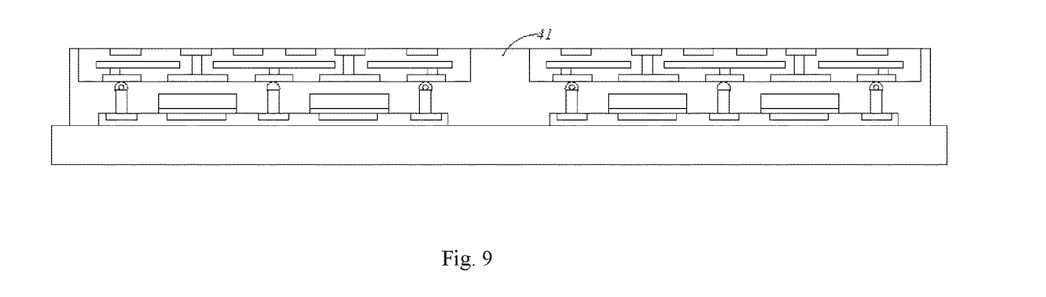

In S4, as shown in FIG. 9, a plastic packaging material filling the first plastic packaging layer 41 wraps the substrate layer 1, the interconnection structural members 6, the antenna support member 2 and the first antenna layer 3. The first plastic packaging layer 41 may not cover a chip surface of the substrate layer 1 during plastic packaging; or may cover the chip surface of the substrate layer 1 at first, and then the first plastic packaging layer 41 is thinned to expose pads on the chip surface of the substrate layer 1.

Organic polymer resin with inorganic filler, or organic polymer resin with glass fiber cloth and filler, or a polymer composite material with filler such as epoxy resin, polyimide or dry film is used as a plastic packaging material to be deposited on the substrate layer 1 to encapsulate the interconnection structural members, the antenna support member 2 and the first antenna layer 3, thereby forming the first plastic packaging layer 41.

In some other embodiments of the present invention, before filling of the plastic packaging material, the packaging method further includes the following step.

Figure 10:
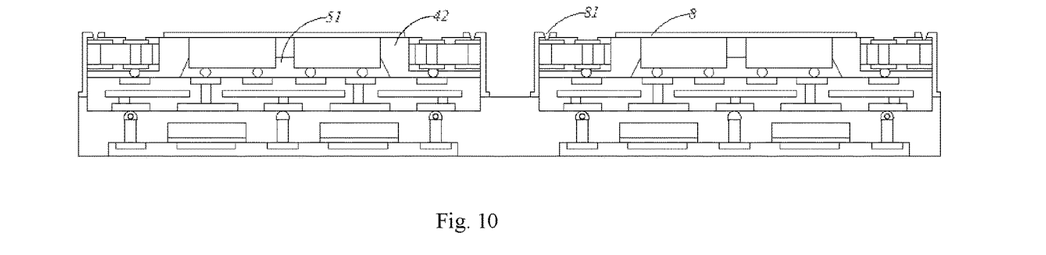
Figure 11:
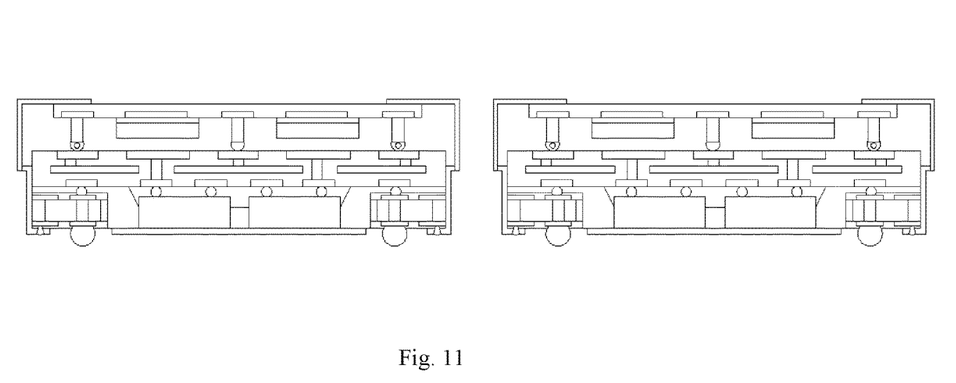

In S5, as shown in FIG. 10 and FIG. 11, the temporary carrier plate 9 is removed, the interconnection structural members 6 and at least one chip 5 are disposed on the chip circuit layer 11, the second plastic packaging layer 42 is formed, and a single antenna packaging structure is formed by cutting. The temporary carrier plate 9 may also be removed after the second plastic packaging layer 42 is formed.

The temporary carrier plate 9 is peeled off by laser debonding separation, mechanical peeling, chemical etching, mechanical grinding and other methods.

The complete packaging structure is divided into individual packaging structures along a cutting path by a saw blade or a laser cutting apparatus.

Further, in some embodiments of the present invention, before plastic packaging of the chip 5, the packaging method further includes the following step:

coating underfill 51 between the chip 5 and the chip circuit layer 11.

Further, in some embodiments of the present invention, the method, while disposing the chip 5, also includes the following step:

disposing a microwave integrated circuit and/or power management chip and/or passive device on the chip circuit layer 11. The passive device includes a capacitor, a resistor and the like, or other functional devices such as a heat-radiating fin and a reinforcement rib.

In some embodiments of the present invention, before cutting to form the single antenna packaging structure, the packaging method further includes the following steps:

partially cutting the plastic packaging layer, sequentially depositing an adhesive layer, a main shielding layer and a protective layer on the outer side of the antenna packaging structure to form an electromagnetic shielding layer 8, the electromagnetic shielding layer 8 at least covering the chip 5 and the chip circuit layer 11, and forming a through hole 81 exposing the metal structural member in the electromagnetic shielding layer 8, and filling the through hole 81 with sintered conductive paste or soldering tin.

Specifically, the electromagnetic shielding layer 8 includes the adhesive layer attached to the plastic packaging layer 4, the protective layer exposed to air, and the main shielding layer disposed between the adhesive layer and the protective layer. The adhesive layer is made of a metal material with higher adhesion, such as copper, or an organic material with high adhesion. The main shielding layer is made of a sputtering interlayer metal film material such as copper, stainless steel or titanium, or conductive resin containing high-density metal filler such as silver/copper and other conductive composite materials, or a combination of at least two of the above materials. The protective layer is a stainless steel NiV (7%) or CrCu alloy layer, or an organic moisture barrier layer, etc. The electromagnetic shielding layer 8 may also be formed after full cutting.

In some embodiments of the present invention, before or after cutting to form the single antenna packaging structure, the packaging method further includes the following step:

forming a first moisture barrier layer 7 at the outer side of the antenna packaging structure, the first moisture barrier layer 7 at least wrapping the first antenna layer 3, the antenna support member 2 and the second antenna layer 13.

It should be noted that the sequence of part of steps in the present invention may be exchanged and adjusted. For example, the chip 5 and the substrate layer 2 may be disposed on the temporary carrier plate 9 at first, and then the temporary carrier plate 9 is removed to form the antenna support member 2 and the antenna layers, as long as the chip and the antenna layer packaging structure which are relatively distributed can be formed.

In summary, according to the present invention, an antenna and the chip are respectively disposed on two sides of the substrate layer, the antenna layers are formed by the antenna support member, the first antenna layer located above the antenna support member and the second antenna layer located below the antenna support member together, and the interlayer dielectrics of the antenna support member and the antenna layers are low dielectric loss materials, so that a heterogeneous and isomerous antenna structure is formed, thereby reducing the problems such as current leakage and stray capacitance in the packaging structure caused by dielectric loss, and favorably reducing a size of the antenna packaging structure.

It should be understood that, although the description is described in terms of the embodiments, each of the embodiments is not intended to contain an independent technical solution. Such description manner of the description is merely intended for clarity. Those skilled in the art should take the description as a whole, and the technical solutions in respective embodiments may also be combined appropriately to form other embodiments understandable by those skilled in the art.

The series of detailed descriptions listed above are merely specifically illustrative of the possible embodiments of the present invention, and are not intended to limit the protective scope of the present invention. The equivalent embodiments or alterations made without departing from the technology and spirit of the present invention should be included within the protective scope of the present invention.

What is claimed is:

1. An antenna packaging structure, wherein:

the antenna packaging structure comprises a substrate layer, interconnection structural members, an antenna support member, a first antenna layer, a chip and a plastic packaging layer;

the substrate layer comprises at least one chip circuit layer, at least one antenna control layer and at least one second antenna layer which are stacked in sequence, and dielectric loss tangent values of interlayer dielectrics of the first antenna layer and the second antenna layer are less than 0.01 respectively;

the first antenna layer is electrically connected to the second antenna layer through the interconnection structural members;

the antenna support member is attached to one side of the first antenna layer toward the second antenna layer, and has a dielectric loss tangent value less than 0.01;

the chip is disposed on the control circuit layer opposite to the first antenna layer; and the plastic packaging layer wraps the substrate layer, the antenna support member, the first antenna layer, the interconnection structural members and the chip.

2. The antenna packaging structure according to claim 1, wherein the antenna support member is one or more of a single-layer or multi-layer organic composite substrate, a plastic packaging part, a glass part and a low-temperature co-fired ceramic part.

3. The antenna packaging structure according to claim 2, wherein the antenna support member is a pure dielectric member or a resonant cavity with metal on other five side surfaces except a surface connected to the first antenna layer.

4. The antenna packaging structure according to claim 3, wherein interlayer dielectric materials of the first antenna layer and the second antenna layer are resin with a dielectric constant not greater than 3.9 or a polymer dielectric material with filler, the antenna control layer comprises an antenna signal control circuit and an antenna signal sending and receiving circuit.

5. The antenna packaging structure according to claim 3, wherein the antenna packaging structure is provided with a first moisture barrier layer on an outer side of the plastic packaging layer, and the first moisture barrier layer at least wraps the first antenna layer, the antenna support member and the second antenna layer.

6. The antenna packaging structure according to claim 2, wherein the antenna packaging structure is further provided with an electromagnetic shielding layer at the outer side of the packaging layer; the electromagnetic shielding layer at least covers a side direction of the chip and a side direction of the chip circuit layer; the electromagnetic shielding layer comprises an adhesive layer attached to the plastic packaging layer, a protective layer exposed to air, and a main shielding layer disposed between the adhesive layer and the protective layer; the side wall of the interconnection structural member is provided with a metal structural member; and the metal structural member is exposed to the plastic packaging layer and electrically connected to the electromagnetic shielding layer in a grounding way, the electromagnetic shielding layer is provided with a through hole for exposing the metal structural member, and the through hole is filled with sintered conductive paste or soldering tin.

7. The antenna packaging structure according to claim 1, wherein the antenna packaging structure further comprises the interconnection structural members disposed on the second antenna layer and the chip circuit layer, and the interconnection structural members are electrically connected to a circuit of the substrate layer.

8. The antenna packaging structure according to claim 7, wherein the interconnection structural members are conductive metal posts and/or composite structural members.

9. The antenna packaging structure according to claim 8, wherein the composite structural member comprises a main body member made of a dielectric material, and a conductive through hole located inside the main body member and configured to communicate upper and lower surfaces of the main body member, a metal connector or conductive filler is disposed in the conductive through hole to be electrically connected to the circuit layer, and the composite structural members disposed on one side of the second antenna layer are distributed in gaps and at peripheral sides of the antenna support member.

10. The antenna packaging structure according to claim 9, wherein parts of the interconnection structural members located on both sides of the packaging structure are further provided with lateral antenna layers, and the lateral antenna layers are disposed toward side edges of the antenna packaging structure, a side wall of the interconnection structural member is provided with a heat-radiating structural member and/or a second moisture barrier layer, and the second moisture barrier layer is exposed to or buried in the plastic packaging layer.

11. The antenna packaging structure according to claim 7, wherein a plastic pre-packaging layer is disposed at peripheral sides of the antenna support member and the interconnection structural members.

12. The antenna packaging structure according to claim 11, wherein the plastic packaging layer comprises a first plastic packaging layer and a second plastic packaging layer, the first plastic packaging layer at least wraps an upper surface of the substrate layer, a side surface of the antenna support member, side surfaces of the interconnection structural members and the first antenna layer, the second plastic packaging layer at least wraps a side surface of the chip and the side surfaces of the interconnection structural members, and a material of the first plastic packaging layer and a material of the second plastic packaging layer are different.

13. A packaging method of an antenna packaging structure, comprising the following steps:
providing a temporary carrier plate, and disposing a first antenna layer and interconnection structural members on the temporary carrier plate, the first antenna layer taking a dielectric material with a dielectric loss tangent value less than 0.01 as an interlayer dielectric;
attaching an antenna support member with a dielectric loss tangent value less than 0.01 on the first antenna layer;
forming at least one second antenna layer, at least one antenna control layer and at least one chip circuit layer into a prefabricated substrate layer single block or strip, and electrically bonding the interconnection structural members on the first antenna layer, the second antenna layer taking a dielectric material with a dielectric loss tangent value less than 0.01 as an interlayer dielectric;
filling a first plastic packaging layer to wrap the substrate layer, the interconnection structural members, the antenna support member and the first antenna layer; and
removing the temporary carrier plate, disposing the interconnection structural members and at least one chip on the chip circuit layer, forming a second plastic packaging layer, and forming a single antenna packaging structure by cutting.

14. The packaging method according to claim 13, wherein the antenna support member is one or more of an organic single-layer or multi-layer composite substrate, a plastic packaging layer, a glass part and a low-temperature co-fired ceramic part, and the antenna support member is a pure dielectric member or a resonant cavity with metal on other five side surfaces except a surface connected to the first antenna layer, an interlayer dielectric material of the second antenna layer is resin with a dielectric constant not greater than 3.9 or a polymer dielectric material with filler, the chip circuit layer comprises an antenna signal control circuit and an antenna signal sending and receiving circuit.

15. The packaging method according to claim 13, wherein the interconnection structural members on the second antenna layer are conductive metal posts, the interconnection structural member comprises a main body member made of a dielectric material, and a metal connector located inside the main body member and configured to communicate upper and lower surfaces of the main body member, and the metal connector is electrically connected to a circuit layer on the substrate layer.

16. The packaging method according to claim 15, wherein the interconnection structural members disposed on one side of the second antenna layer are distributed in gaps and at peripheral sides of the antenna support member, and upper surfaces of the interconnection structural members are lower than an upper surface of the first antenna layer.

17. The packaging method according to claim 16, wherein parts of the interconnection structural members located on both sides of the packaging structure are further provided with lateral antenna layers, and the lateral antenna layers are disposed toward side edges of the antenna packaging structure, a side wall of the interconnection structural member is provided with a heat-radiating structural member and/or a second moisture barrier layer, and the second moisture barrier layer is exposed to the plastic packaging layer.

18. The packaging method according to claim 13, further comprising the following step:
   sequentially depositing an adhesive layer, a main shielding layer and a protective layer on an outer side of the antenna packaging structure to form an electromagnetic shielding layer, the electromagnetic shielding layer at least covering the chip and the chip circuit layer.

19. The packaging method according to claim 18, wherein the electromagnetic shielding layer is provided with a through hole for exposing the interconnection structural member, and the through hole is filled with sintered conductive paste or soldering tin.

20. The packaging method according to claim 13, further comprising the following step:
   forming a first moisture barrier layer on the outer side of the antenna packaging structure, the first moisture barrier layer at least wrapping the first antenna layer, the antenna support member and the second antenna layer.

* * * * *